(12) United States Patent
Lee et al.

(10) Patent No.: US 8,163,095 B2
(45) Date of Patent: Apr. 24, 2012

(54) COMPOSITION FOR STRIPPING AND STRIPPING METHOD

(75) Inventors: Ji Sun Lee, Cheonan-Si (KR); Hong Sick Park, Suwon-Si (KR); Jong Hyun Choung, Hwaseong-Si (KR); Sun Young Hong, Yongin-Si (KR); Bong Kyun Kim, Incheon (KR); Byeong Jin Lee, Yongin-Si (KR); Byung Uk Kim, Incheon (KR); Jong Hyun Jeong, Incheon (KR); Suk Il Yoon, Incheon (KR); Seong Bae Kim, Incheon (KR); Sung Gun Shin, Incheon (KR); Soon Beom Huh, Incheon (KR); Se Hwan Jung, Incheon (KR); Doo Young Jang, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/101,973

(22) Filed: May 5, 2011

(65) Prior Publication Data

US 2011/0206829 A1 Aug. 25, 2011

Related U.S. Application Data

(62) Division of application No. 12/214,658, filed on Jun. 20, 2008, now Pat. No. 7,968,507.

(30) Foreign Application Priority Data

Sep. 28, 2007 (KR) .................. 10-2007-0098028

(51) Int. Cl.
*C11D 7/50* (2006.01)

(52) U.S. Cl. .................. 134/1.3; 510/175; 510/176

(58) Field of Classification Search ............ 510/175, 510/176; 134/1.3
See application file for complete search history.

(56) References Cited

U.S. PATENT DOCUMENTS

| | | | |
|---|---|---|---|
| 4,904,571 A | 2/1990 | Miyashita et al. | |
| 5,795,702 A | 8/1998 | Tanabe et al. | |
| 5,904,156 A * | 5/1999 | Advocate et al. | 134/2 |
| 7,049,275 B2 * | 5/2006 | Ikemoto et al. | 510/176 |
| 7,078,371 B2 * | 7/2006 | Ikemoto | 510/176 |
| 7,135,445 B2 * | 11/2006 | Charm et al. | 510/175 |
| 7,442,675 B2 | 10/2008 | Yokoi et al. | |
| 7,543,592 B2 * | 6/2009 | Lee | 134/1.3 |
| 7,579,308 B2 * | 8/2009 | Lee | 510/175 |
| 7,968,507 B2 * | 6/2011 | Lee et al. | 510/175 |

(Continued)

FOREIGN PATENT DOCUMENTS

CN 1577112 A 2/2005

(Continued)

*Primary Examiner* — Gregory Webb
(74) *Attorney, Agent, or Firm* — Innovation Counsel LLP (57) ABSTRACT

The present invention provides a stripping composition and a stripping method capable of easily stripping a color resist or an organic insulating film formed on a substrate to reuse the substrate when defects are found during a process of forming the color filter or organic insulating film on the substrate. In one embodiment, the stripping composition includes about 0.5 to about 45 wt % of hydroxide compound, about 10 to about 89 wt % of alkyleneglycolalkylether compound, about 5 to about 45 wt % of alkanolamine compound, and about 0.01 to about 5 wt % of inorganic salt compound. Advantageously, the stripping process can be performed without damaging a thin film transistor of a bottom substrate while removing the color resist or organic insulating film.

8 Claims, 1 Drawing Sheet

U.S. PATENT DOCUMENTS

| | | | |
|---|---|---|---|
| 2003/0087179 A1* | 5/2003 | Iwasaki | 430/166 |
| 2003/0181344 A1* | 9/2003 | Ikemoto et al. | 510/175 |
| 2004/0038840 A1* | 2/2004 | Lee et al. | 510/202 |
| 2004/0048761 A1* | 3/2004 | Ikemoto | 510/175 |
| 2004/0147421 A1* | 7/2004 | Charm et al. | 510/176 |
| 2005/0263743 A1* | 12/2005 | Lee | 252/364 |
| 2005/0287480 A1 | 12/2005 | Takashima | |
| 2006/0094613 A1* | 5/2006 | Lee | 510/175 |
| 2006/0115970 A1* | 6/2006 | Lee | 438/584 |
| 2007/0078072 A1* | 4/2007 | Yokoi et al. | 510/175 |
| 2007/0243773 A1* | 10/2007 | Phenis et al. | 439/892 |
| 2009/0084406 A1* | 4/2009 | Lee et al. | 134/18 |
| 2010/0022426 A1* | 1/2010 | Yokoi et al. | 510/176 |
| 2010/0104824 A1* | 4/2010 | Phenis et al. | 428/195.1 |

FOREIGN PATENT DOCUMENTS

CN 101000468 A 7/2007

\* cited by examiner

COMPOSITION FOR STRIPPING AND STRIPPING METHOD

CROSS REFERENCE TO RELATED APPLICATION

This is a divisional application of U.S. patent application Ser. No. 12/214,658 filed on Jun. 20, 2008, which application claims priority from Korean Patent Application No. 10-2007-98028 filed on Sep. 28, 2007, in the Korean Intellectual Property Office, the disclosures of which are incorporated herein by their references in their entireties.

BACKGROUND OF THE INVENTION

1. Field of the Invention

The present invention relates to a composition for stripping and a stripping method, and more specifically, a composition and a method for easily stripping a color resist or organic insulating film formed on a substrate for reuse of the substrate when defects occur during a process of forming the color filter or organic insulating film on the substrate.

2. Description of the Related Art

In a liquid crystal display device, a top substrate includes: red, green and blue color filters; a black matrix for preventing light leakage between each pixel and improving contrast ratio; and a common electrode for applying a voltage to liquid crystal cells.

A process of manufacturing the color filter on the top substrate is as follows. $Cr/CrO_x$ or an organic material that is used as a material for the black matrix according to its use is applied on a glass substrate to form a pattern. A black mask pattern is formed. Thereafter, a color resist pattern is formed by a photolithography technique in order to display colors. The color resist is applied on the glass substrate, and exposed to be cured by photopolymerization. After exposure, the unexposed region of the color resist is removed by development, and the color resist goes through a baking process.

The color resist is produced by a pigment dispersion method, a dyeing method, an electrodeposition method or the like, and the pigment dispersion method is frequently used. The organic pigments to display colors are generally dispersed in a photosensitive composition for photoresist including a photopolymerization initiator, a monomer, and a binder. The photopolymerization initiator is a highly sensitive compound capable of generating radicals when irradiated. The monomers form a polymer by radicals after the initiation of polymerization reaction and become insoluble in the solvent. The binder protects the liquid monomers from a developer at room temperature, and affects stability of pigment dispersion, and reliability of heat-resistance, light-resistance, and drug-resistance of red, green, and blue patterns.

Until now, once the color resist is cured during the process of manufacturing the color filter, it is impossible to remove or repair only the defective portion of the pattern. Further, since there is no appropriate solvent to remove the color resist, the substrate on which the defective color filter is formed has been discarded.

The color resist is a negative type resist, which is typically difficult to remove by stripping as compared to a positive type resist, thereby making desirable an improved stripping performance.

Specifically, in a case where the color filter is formed on a thin film transistor of a bottom substrate, an electrode formed of a metal including Al can be damaged during removal of the color resist. Thus, the stripping performance to solve these problems has been demanded.

In addition, an appropriate stripping composition capable of removing the negative type organic insulating film formed on the thin film transistor is not well established presently, which increases demand for a composition capable of stripping the films.

For the reasons described above, an inorganic stripping solution and reactive ion etching (RIE) using plasma have been conventionally used. However, to use the inorganic stripping solution, sulfuric acid, nitric acid, fuming sulfuric acid, and a mixed solution of nitric acid and hydrogen peroxide are heated to 120° C. or more, which requires the greatest caution while handling to ensure the user's safety and to avoid risk of fire.

An RIE method using plasma for removing a cured color resist, which is hardly removed by a conventional wet etching method, is disclosed in U.S. Pat. No. 5,756,239, in which $O_2$-RIE and $SF_6$-RIE are used continuously. Further, a method of removing an absorption layer of a color resist by plasma using oxygen and removing a barrier layer of a color resist by RIE using sulfur hexafluoride or nitrogen trifluoride is disclosed in U.S. Pat. No. 5,059,500, in which polyester, polyamide, and novolac resin are used as an absorption layer and polysilane, polysiloxane, an organosilicon compound, silica, silicon nitride and mixtures thereof are used as a barrier layer. However, the method of etching the color filter by using plasma has practical limitations because it requires high vacuum and high energy, the control over process conditions is difficult, the method can not be used for a wide area, and expensive equipment is used.

As such, a large amount of color resist cannot be easily removed by conventional methods due to concern over user safety and decreased productivity and yield.

SUMMARY OF THE INVENTION

An aspect of the present invention provides a stripping composition capable of easily removing a color resist or organic insulating film.

Another aspect of the present invention provides a stripping composition and stripping method to remove a color resist or negative type organic insulating film formed on a thin film transistor.

Still another aspect of the invention provides a stripping composition and stripping method which do not damage a thin film transistor of a bottom substrate, when removing a color resist or organic insulating film.

An aspect of the present invention provides a stripping composition including 0.5 to 45 wt % of a hydroxide compound, 10 to 89 wt % of an alkyleneglycolalkylether compound, 5 to 45 wt % of an alkanolamine compound and 0.01 to 5 wt % of an inorganic salt compound.

In this connection, the hydroxide compound has an alkyl group having 1 to 4 carbon atoms, and may include one selected from the group consisting of inorganic alkali hydroxide, alkyl ammonium hydroxide, alkylallyl ammonium hydroxide and combinations thereof. The inorganic alkali hydroxide may include one selected from the group consisting of lithium hydroxide, sodium hydroxide, potassium hydroxide and combinations thereof.

Further, the alkyl ammonium hydroxide may include one selected from the group consisting of tetraethyl ammonium hydroxide, tetramethyl ammonium hydroxide (TMAH), tetrabutyl ammonium hydroxide, trimethylbenzyl ammonium hydroxide, ammonium hydroxide and combinations thereof. The alkylallyl ammonium hydroxide may include one selected from the group consisting of ammonium hydroxide, tetramethylammoniumhydroxide, tetraethylammoniumhydroxide, tetrabutylammoniumhydroxide, tetrabenzylammoniumhydroxide and combinations thereof.

Further, the alkyleneglycolalkylether compound includes an alkyl group having 1 to 4 carbon atoms, and may include one selected from the group consisting of mono alkyleneglycolmonoalkylether, dialkyleneglycolmonoalkylether, trialkylenemonoalkylether and combinations thereof.

The alkyleneglycolalkylether compound may include one selected from the group consisting of ethyleneglycol monobutylether, diethyleneglycol monobutyl ether, triethyleneglycol monobutylether, ethyleneglycolmonomethylether, diethyleneglycolmonomethylether, triethyleneglycolmonoether, triethyleneglycolmonomethylether, ethyleneglycolmonoethylglycol, propyleneglycolmonomethylether, dipropyleneglycolmonomethylether, tripropyleneglycolmonomethylether and combinations thereof.

Further, the alkanolamine compound may include at least one functional group represented by the following Formula (I) in the molecule.

(I)

(wherein $R^1$ and $R^2$ include a hydrogen atom, respectively and are $C_1$-$C_8$ alkyl or $C_1$-$C_8$ alkenyl)

The alkanolamine compound can be represented by the following Formula (II).

(II)

(wherein $R^1$ and $R^2$ are as defined above, $R^3$ is $C_1$-$C_{10}$ alkyl, $C_1$-$C_{10}$ alkenyl, amino, $C_1$-$C_{10}$ hydroxyalkyl, $C_1$-$C_{10}$ aminoalkyl, ($C_1$-$C_{10}$ alkyl)phenyl, phenyl($C_1$-$C_{10}$)alkyl, $C_1$-$C_{10}$ alkoxy, ($C_1$-$C_{10}$)alkoxy($C_1$-$C_{10}$)alkyl, hydroxy($C_1$-$C_{10}$)alkyloxy($C_1$-$C_{10}$)alkyl, $C_1$-$C_{10}$alkylamino, amino($C_1$-$C_{10}$)alkyloxy($C_1$-$C_{10}$)alkyl, hydroxy($C_1$-$C_{10}$)alkylamino ($C_1$-$C_{10}$)alkyl; $R^4$ is hydrogen, $CH_2OH$, $-CH(OH)CH_3$, $C_1$-$C_{10}$ alkyl, $C_1$-$C_{10}$ alkenyl, amino, $C_1$-$C_{10}$ hydroxyalkyl, $C_1$-$C_{10}$ aminoalkyl, ($C_1$-$C_{10}$ alkyl)phenyl, phenyl($C_1$-$C_{10}$)alkyl, $C_1$-$C_{10}$ alkoxy, ($C_1$-$C_{10}$)alkoxy($C_1$-$C_{10}$)alkyl, hydroxy ($C_1$-$C_{10}$)alkyloxy($C_1$-$C_{10}$)alkyl, $C_1$-$C_{10}$alkylamino, amino ($C_1$-$C_{10}$)alkyloxy($C_1$-$C_{10}$)alkyl, hydroxy($C_1$-$C_{10}$)alkylamino($C_1$-$C_{10}$)alkyl; or $R^3$ and $R^4$ may bind with nitrogen to form a cyclic amino group having 1 to 12 carbon atoms.)

Further, in another embodiment, $R^1$ and $R^2$ are each hydrogen, or $R^1$ may be hydrogen and $R^2$ may be methyl.

The alkanolamine compound may include one selected from the group consisting of (1) stripping aliphatic alkanolamines such as N-hydroxymethylmethylamine, N-hydroxymethyldimethylamine, N,N-dihydroxymethylmethylamine, N-α-hydroxyethyl)methylamine, N-(α-hydroxyethyl)dimethylamine, N,N-(di-α-hydroxyethyl)methylamine, N-hydroxymethylethylamine, N-hydroxymethyldiethylamine, N,N-dihydroxymethylethylamine, N-(α-hydroxyethyl)ethylamine, N-α-hydroxyethyl)diethylamine, N,N-(di-α-hydroxyethyl)ethylamine, N-hydroxymethylpropylamine, N-hydroxymethyldipropylamine, N,N-dihydroxymethylpropylamine, N-(α-hydroxyethyl)propylamine, N-α-hydroxyethyl)dipropylamine, N,N-(di-α-hydroxyethyl)propylamine, N-hydroxymethylbutylamine, N-hydroxymethyldibutylamine, N,N-dihydroxymethylbutylamine, N-(α-hydroxyethyl)butylamine, N-α-hydroxyethyl)dibutylamine, N,N-(di-α-hydroxyethyl)butylamine, N-hydroxymethylpentylamine, N-hydroxymethyldipentylamine, N,N-dihydroxymethylpentylamine, N-(α-hydroxyethyl)pentylamine, N-hydroxymethylhexylamine, N-hydroxymethyldihexylamine, N,N-dihydroxymethylhexylamine, N-(α-hydroxyethyl)hexylamine, N-hydroxymethylheptylamine, N-hydroxymethyldiheptylamine, N,N-dihydroxymethylheptylamine, N-hydroxymethyloctylamine, N-hydroxymethyldioctylamine, N,N-dihydroxymethyloctylamine, N-α-hydroxyethyl)octylamine, N-hydroxymethylmethylethylamine, N-α-hydroxyethyl)methylethylamine, N-hydroxymethylmethylpropylamine, N-α-hydroxyethyl)methylpropylamine, N-hydroxymethylmethylbutylamine, N-(α-hydroxyethyl)methylbutylamine, N-hydroxymethylethylpropylamine, N-α-hydroxyethyl)ethylpropylamine, N-hydroxymethylethylbutylamine, N-α-hydroxyethyl)ethylbutylamine, N-hydroxymethylethanolamine (CAS No. 65184-12-5), N-(α-hydroxyethyl) ethanolamine, N,N-dihydroxymethylethanolamine, N,N-(di-α-hydroxyethyl)ethanolamine, N-hydroxymethyldiethanolamine, N-(α-hydroxyethyl)diethanolamine, N-hydroxymethyl-N-methylethanolamine, N-α-hydroxyethyl)-N-methylethanolamine, N-hydroxymethyl-N-propylethanolamine, N-α-hydroxyethyl)-N-propylethanolamine, N-hydroxymethyl-N-butylethanolamine, N-α-hydroxyethyl)-N-butylethanolamine, N-hydroxymethylisopropanolamine (CAS No. 76733-35-2), N-(α-hydroxyethyl)isopropanolamine, N,N-dihydroxymethylisopropanolamine, N,N-(di-α-hydroxyethyl)isopropanolamine, N-hydroxymethyldiisopropanolamine, N-(α-hydroxyethyl) diisopropanolamine, N-hydroxymethyl-N-methylisopropanolamine, N-(α-hydroxyethyl)-N-methylisopropanol amine, N-hydroxymethyl-N-ethyl isopropanolamine, N-α-hydroxyethyl)-N-ethylisopropanolamine, N-hydroxymethyl-N-propylisopropanolamine, N-(α-hydroxyethyl)-N-propylisopropanolamine, N-hydroxymethyl-N-butylisopropanolamine, N-(α-hydroxyethyl)-N-butylisopropanolamine, N-hydroxymethylaminoethoxyethanol, N-(α-hydroxyethyl)aminoethoxyethanol, N,N-dihydroxymethylaminoethoxyethanol, N,N-(di-α-hydroxyethyl)aminoethoxyethanol, N-hydroxymethylamino-2-methylpropanol, N-(α-hydroxyethyl)amino-2-methylpropanol, N,N-dihydroxymethylamino-2-methylpropanol, and N,N-(di-α-hydroxyethyl) amino-2-methylpropanol; (2) aliphatic alkanol polyamines such as N-hydroxymethylethylenediamine (CAS No. 41434-24-6), N-α-hydroxyethyl)ethylenediamine, N,N-dihydroxymethylethylenediamine (CAS No. 70495-38-4), N-hydroxymethylbutylenediamine (CAS No. 66210-83-1), N-hydroxymethylpropylenediamine (CAS No. 66210-82-0), N,N'-dihydroxymethylbutylenediamine, N,N-dihydroxymethylbutylenediamine, N,N,N'-trihydroxymethylbutylenediamine, N,N,N'N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N,N-(di-α-hydroxyethyl)ethylenediamine, N,N,N'-trihydroxymethylethylenediamine, N,N,N'-(tri-α-hydroxyethyl)ethylenediamine, N,N,N'N'- tetrahydroxymethylethylenediamine, N,N,N'N'-(tetra-α-hydroxyethyl)ethylenediamine, N-hydroxymethyl-N-methylethylenediamine, N-(α-hydroxyethyl)-N-methylethylenediamine, N,N'-dihydroxymethyl-N-methylethylenediamine, N,N'-(di-α-hydroxyethyl)-N-methylethylenediamine, N,N',N'-(tri-α-hydroxyethyl)-N-methylethylenediamine, N,N',N'-trihydroxymethyl-N-methylethylenediamine, N-hydroxymethyl-N',N'-dimethylethylenediamine, N-(α-hydroxyethyl)-N',N'-dimethylethylenediamine, N,N-dihydroxymethyl-N',N'-dimethylethylenediamine, N,N-(di-α-hydroxyethyl)-N',N'-dimethylethylenediamine, N-hydroxymethyl-N,N',N'-trimethylethylenediamine, N-α-hydroxyethyl)-N,N',N'-trimethylethylenediamine, N-hydroxymethyl-N-ethylethylenediamine, N,N'-dihydroxymethyl-N-ethylethylenediamine, N,N',N'-trihydroxymethyl-N-methylethylenediamine, N-hydroxymethyl-N',N'-diethylethylenediamine, N,N-dihydroxymethyl-N',N'-diethylethylenediamine, N-hydroxymethyl-N,N'N'-triethylenediamine, N-hydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethylbutylenediamine, N,N-dihydroxymethylbutylenediamine, N,N,N'-trihydroxymethylbutylenediamine, N,N,N',N'-tetrahydroxymethylbutylenediamine, N-hydroxymethyldiethylenetriamine, N,N"-dihydroxymethyldiethylenetriamine and N-hydroxymethyltriethylenetetramine; (3) aliphatic alkanol unsaturated amines such as N-hydroxymethylallylamine, N,N-dihydroxymethylallylamine, N-(α-hydroxyethyl)allylamine, N,N-(di-α-hydroxyethyl)allylamine, N-hydroxymethyldiallylamine, N-hydroxymethyl-N-methylallylamine and N-hydroxymethyl-N-ethylallylamine; (4) stripping cyclic alkanolamines such as N-hydroxymethylpyrrole, N-(α-hydroxyethyl)pyrrole, N-hydroxymethyl-methylpyrrole, N-hydroxymethyl-dimethylpyrrole, N-hydroxymethyl-trimethylpyrrole, N-hydroxymethylpyrrolidine, N-(α-hydroxyethyl)pyrrolidine, N-hydroxymethyl-methylpyrrolidine, N-hydroxymethylpyrazole, N-hydroxymethylimidazole, N-hydroxymethyltriazole, N-hydroxymethyltetrazole, N-hydroxymethylpiperidine, N-α-hydroxyethyl)piperidine, N-hydroxymethylpipecoline, N-hydroxymethyllupetidin, N-hydroxymethylpiperazine, N,N-dihydroxymethylpiperazine, N-α-hydroxyethyl)piperazine, N-hydroxymethylmethylpiperazine, N-hydroxymethylmorpholine and N-(α-hydroxyethyl)morpholine; (5) aliphatic alkanol etheramines such as N-hydroxymethylmethoxyethylamine, N-α-hydroxyethyl) methoxyethylamine, N,N-dihydroxymethylmethoxyethylamine, N-hydroxymethylmethoxypropylamine, N,N-dihydroxymethylmethoxypropylamine, N-hydroxymethylethoxyethylamine, N-(α-hydroxyethyl) ethoxyethylamine, N,N-dihydroxymethylethoxyethylamine, N-hydroxymethylethoxypropylamine and N,N-dihydroxymethylethoxypropylamine; and combinations thereof.

The alkanolamine compound may further include at least one additive amine selected from the group consisting of alkylamine, alkanolamine, polyamine, hydroxylamine, cyclic amine and combinations thereof. The alkylamine may include one selected from the group consisting of aliphatic primary alkylamines such as methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine and octadecylamine; aliphatic secondary alkylamines such as dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine and propylisobutylamine; aliphatic tertiary alkylamines such as trimethylamine, triethylamine, tripropylamine, tributylamine, tripentylamine, dimethylethylamine, dimethylpropylamine, methyldiethylamine, methyldipropylamine; and combinations thereof. The alkanolamine may include one selected from the group consisting of aliphatic alkanolamines such as ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropan-1-ol, N-methyl-2-aminopropan-1-ol, N-ethyl-2-aminopropan-1-ol, 1-aminopropan-3-ol, N-methyl-1-aminopropan-3-ol, N-ethyl-1-aminopropan-3-ol, 1-aminobutan-2-ol, N-methyl-1-aminobutan-2-ol, N-ethyl-1-aminobutan-2-ol, 2-aminobutan-1-ol, N-methyl-2-aminobutan-1-ol, N-ethyl-2-aminobutan-1-ol, 3-aminobutan-1-ol, N-methyl-3-aminobutan-1-ol, N-ethyl-3-aminobutan-1-ol, 1-aminobutan-4-ol, N-methyl-1-aminobutan-4-ol, N-ethyl-1-aminobutan-4-ol, 1-amino-2-methylpropan-2-ol, 2-amino-2-methylpropan-1-ol, 1-aminopentan-4-ol, 2-amino-4-methylpentan-1-ol, 2-aminohexan-1-ol, 3-aminoheptan-4-ol, 1-aminooctan-2-ol, 5-aminooctan-4-ol, 1-aminopropan-2,3-diol, 2-aminopropan-1,3-diol, tris(oxymethyl)aminomethane, 1,2-diaminopropan-3-ol, 1,3-diaminopropan-2-ol, 2-(2-aminoethoxy) ethanol and combinations thereof. The polyamines may include one selected from the group consisting of ethylenediamine, propylenediamine, butylenediamine, trimethylenediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, N-methylethylenediamine, N,N-dimethylethylenediamine, trimethylethylenediamine, N-ethylethylenediamine, N,N-diethylethylenediamine, triethylethylenediamine, 1,2,3-triaminopropane, tris(2-aminoethyl)amine, tetra (aminomethyl)methane, diethylenetriamine, triethylenetetramine, tetraethylenepentamine, heptaethyleneoctamine, nonaethylenedecamine and combinations thereof. The hydroxylamines may include one selected from the group consisting of hydroxylamine, N-methylhydroxylamine, N-ethylhydroxylamine, N,N-diethylhydroxylamine and combinations thereof. The cyclic amines may include one selected from the group consisting of pyrrole, 2-methylpyrrole, 3-methylpyrrole, 2-ethylpyrrole, 3-ethylpyrrole, 2,3-dimethylpyrrole, 2,4-dimethylpyrrole, 3,4-dimethylpyrrole, 2,3,4-trimethylpyrrole, 2,3,5-trimethylpyrrole, 2-pyrroline, 3-pyrroline, pyrrolidine, 2-methylpyrrolidine, 3-methylpyrrolidine, pyrazole, imidazole, 1,2,3-trizaole, 1,2,3,4-tetrazole, piperidine, 2-pipecoline, 3-pipecoline, 4-pipecoline, 2,4-lupetidin, 2,6-lupetidin, 3,5-lupetidin, piperazine, 2-methylpiperazine, 2,5-dimethylpiperazine, 2,6-dimethylpiperazine, morpholine and combinations thereof.

Further, the inorganic salt compound may include one selected from the group consisting of potassium hydroxide, potassiumacetate, potassiumnitrate, potassiumcarbonate, potassiumpyrophsophate and combinations thereof. The stripping composition may further include one selected from the group consisting of a hydroxyl amine compound, a corrosion-resistant agent, a polar solvent, water and combinations thereof.

The hydroxyl amine compound is water soluble and may include one selected from the group consisting of ethanolamines, methanolamines, diethanolamines, triethanolamines and combinations thereof. The hydroxyl amine compound may include one selected from the group consisting of monoethanolamine, monomethanolamine, isopropanolamine, dimethanolamine, diethanolamine, dipropanolamine, trimethanolamine, triethanolamine, tetraethanolamine and combinations thereof.

Further, the corrosion-resistant agent may include one selected from the group consisting of sugars, sugar alcohol, an aromatic hydroxy compound, acetylene alcohol, a carboxylic acid compound and an anhydride thereof, a triazole compound and combinations thereof.

The sugars may include one selected from the group consisting of monosaccharides having 3 to 6 carbon atoms such as glycerine aldehyde, ascorbic acid, iso-ascorbic acid, threose, arabinose, xylose, ribose, ribulose, xylulose, glucose, mannose, galactose, tagatose, allose, altrose, gulose, idose, talose, sorbose, psicose and fructose, disaccharides such as trihalose and combinations thereof. The sugar alcohol may include one selected from the group consisting of threitol, erythritol, adonitol, arabitol, xylitol, talitol, sorbitol, mannitol, iditol, dulcitol, inositol and combinations thereof. The aromatic hydroxy compound may include one selected from the group consisting of phenol, cresol, xylenol, pyrocatechol, resorcinol, hydroquinone, pyrogallol, 1,2,4-benzenetriol, salicylic alcohol, p-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid, gallic acid and combinations thereof. The acetylene alcohol may include one selected from the group consisting of 2-butyene-1,4-diol, 3,5-dimethyl-1-hexyen-3-ol, 2-methyl-3-butyen-2-ol, 3-methyl-1-pentien-3-ol, 3,6-dimethyl-4-octyene-3,6-diol, 2,4,7,9-tetramethyl-5-decyene-4,7-diol, 2,5-dimethyl-3-hexyene-2,5-diol and combinations thereof. The carboxylic acid compound and anhydride thereof may include one selected from the group consisting of formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, diglycolic acid, lactic acid, malic acid, citric acid, acetic anhydride, phthalic anhydride, maleic anhydride, succinic anhydride, salicylic acid and combinations thereof. The triazole compound may include one selected from the group consisting of benzotriazole, o-tolyltriazole, m-tolyltriazole, p-tolyltriazole, carboxybenzotriazole, 1-hydroxybenzotriazole, nitrobenzotriazole, dihydroxypropylbenzotriazole and combinations thereof. The corrosion-resistant agent may include one selected from the group consisting of catechols such as pyrocatechol, sorbitol, xylitol, gallic acid, 2-butyene-1,4-diol, phthalic acid, phthalic anhydride, salicylic acid, ascorbic acid, tolytriazole, benzotriazole and combinations thereof.

Further, the polar solvent may be a sulfur compound or alkyl pyrrolidone. The sulfur compound may include one selected from the group consisting of dimethylsulfoxide, diethylsulfoxide, dipropylsulfoxide, sulforan and mixtures thereof. The alkyl pyrrolidone may include one selected from the group consisting of pyrrolidone, n-methylpyrrolidone, n-ethyl pyrrolidone, n-propyl pyrrolidone, n-octyl pyrrolidone, n-cyclohexyl pyrrolidone, n-dodecyl pyrrolidone, 2-pyrrolidone, 1-hydroxyethyl-2-pyrrolidone, 1-hydropropyl-2-pyrrolidone and combinations thereof.

The stripping composition may further include 0.5 to 10 wt % of hydroxyl amine compound, 0.01 to 5 wt % of corrosion-resistant agent, and a residual amount of water.

The hydroxide compound may be tetramethylammoniumhydroxide, the alkyleneglycolalkylether compound may be ethyleneglycol methylether or diethyleneglycol methylether, the alkanolamine compound may include one selected from the group consisting of mono ethanol amine, diethanol amine, triethanol amine and combinations thereof. The inorganic salt compound may be potassium acetate or potassium hydroxide, the corrosion-resistant agent may include one selected from the group consisting of benzotriazole, catechol, acetylene alcohol, benzotriazole, tritriazole and combinations thereof.

A stripping method according to an aspect of the present invention may include: forming a film containing an organic material on the substrate; and stripping the film on the substrate with a stripping composition containing 0.5 to 45 wt % of hydroxide compound, 10 to 89 wt % of alkyleneglycolalkylether compound, 5 to 45 wt % of alkanolamine compound, and 0.01 to 5 wt % of inorganic salt compound.

The stripping method may further include: inspecting defects of the film; and determining the film to be defective when a defect is detected, before stripping the film.

The film may be a color filter or an organic insulating film. The organic insulating film may be a negative type.

Further, the substrate may include device laminates including a thin film transistor, the film may be formed on the device laminates, and the thin film transistor may include an electrode formed of a metal including Al.

DESCRIPTION OF THE PREFERRED EMBODIMENTS

Hereinafter, the invention will be described in detail. However, the invention is not limited to the following embodiments. Further, the invention may be embodied in many different forms and should not be construed as being limited to the embodiments set forth herein. Rather, these embodiments are provided so that this disclosure will be thorough and complete and will fully convey the concept of the invention to those skilled in the art.

A method of effectively removing a color resist, specifically a color resist or organic insulating film formed on a thin film transistor, more specifically a negative type organic insulating film, is provided to allow for reuse of the substrate that has been previously discarded. The color resist, specifically the color resist or organic insulating film, more specifically the negative type organic insulating film, has been found to be easily removed by using a stripping composition according to the present invention.

The present invention provides a stripping composition including (A) about 0.5 to about 45 wt % of hydroxide compound, (B) about 10 to about 89 wt % of alkyleneglycolalkylether compound, (C) about 5 to about 45 wt % of alkanolamine compound, and (D) about 0.01 to about 5 wt % of inorganic salt compound.

(A) Hydroxide Compound

The hydroxide compound used in the stripping composition according to an embodiment of the present invention is selected from the group consisting of inorganic alkali hydroxide, alkyl ammonium hydroxide, alkylallyl ammonium hydroxide and combinations thereof. Since formation of a color filter on an upper substrate is not affected by a residual metal, inorganic alkali hydroxides may also be used. The hydroxide compound may include an alkyl group having 1 to 4 carbon atoms. The stripping composition may include 0.5 to 45 wt % of hydroxide compound. In a case where the content of hydroxide compound is less than 0.5 wt %, stripping performance of color resist or organic insulating film is degraded because its penetration ability into polymeric components of the color resist or organic insulating film is decreased. Meanwhile, in a case where the content of hydroxide compound is more than 45 wt %, the swelling effect is increased, and inorganic alkali metal is precipitated, whereby a composition of the solution is changed to generate a layer separation, so that the performance may be degraded. Further, a solid can be precipitated as moisture or organic solvent is evaporated during the stripping process, so that the thin film transistor of the substrate, in particular the bottom substrate, can be damaged. Specifically, since alkyl ammonium hydroxide and alkylallyl ammonium hydroxide are not stable, it is preferable that they are dissolved in water.

The inorganic alkali hydroxide may be one selected from the group consisting of lithium hydroxide, sodium hydroxide, potassium hydroxide and combinations thereof. The alkyl ammonium hydroxide may be one selected from the group consisting of tetraethyl ammonium hydroxide, tetramethyl ammonium hydroxide (TMAH), tetrabutyl ammonium hydroxide, trimethylbenzyl ammonium hydroxide, ammonium hydroxide and combinations thereof. Further, the alkylallyl ammonium hydroxide may be one selected from the group consisting of ammonium hydroxide, tetramethylammoniumhydroxide, tetraethylammoniumhydroxide, tetrabutylammoniumhydroxide, tetrabenzylammoniumhydroxide and combinations thereof.

In particular, the tetramethyl ammonium hydroxide (TMAH) can be used to remove the color resist formed on the bottom substrate, as well as the color resist formed on the upper substrate, and used to remove both the positive and negative type organic insulating films.

(B) Alkyleneglycolalkylether Compound

The alkyleneglycolalkylether compound in the stripping composition according to an embodiment of the present invention penetrates into organic polymers to improve its dissolution ability, and as a result washability is improved during post-washing. Further, the compound reduces surface tension between the color resist or organic insulating film and the bottom substrate, in particular, the bottom substrate formed of a metal, so that the color resist or organic insulating film can be easily removed, and the compound functions to dissolve the binder, polymer or the like of the stripped color resist or organic insulating film. Generally, a glycol ether derivative includes both an ether group and a hydroxyl group. Therefore, the glycol ether derivative is used as an excellent solvent which is very well mixed with water and organic solvent. Alkyleneglycolalkylether compound may have 1 to 4 carbon atoms.

According to the present invention, the addition of alkyleneglycolalkylether compound can improve the effect of post-washing, in particular, when it is mixed with alkanolamine compound as described below. As examples of alkyleneglycolalkylether compound, the following compounds such as monoalkyleneglycolmonoalkylether, dialkyleneglycolmonoalkylether, and trialkylenemonoalkylether can be suggested, but the present invention is not limited thereto:

$CH_3CH_2CH_2CH_2$—$OCH_2CH_2$—$OH$;
$CH_3CH_2CH_2CH_2$—$OCH_2CH_2$—$OCH_2CH_2$—$OH$;
$CH_3CH_2CH_2CH_2$—$OCH_2CH_2$—$OCH_2CH_2$—$OCH_2CH_2$—$OH$;
$CH_3CH_2CH_2CH_2$—$OCH_2CH_2$—$OCH_2CH_2$—$OCH_2CH_2$—$OCH_2CH_2$—$OH$;
$CH_3$—$OCH_2CH_2$—$OH$;
$CH_3$—$OCH_2CH_2$—$OCH_2CH_2$—$OH$;
$CH_3$—$OCH_2CH_2$—$OCH_2CH_2$—$OCH_2CH_2$—$OH$;
$CH_3$—$OCH_2CH_2$—$OCH_2CH_2$—$OCH_2CH_2$—$OH$;
$CH_3$—$OCH_2CH_2CH_2$—$OH$;
$CH_3$—$OCH_2CH_2CH_2$—$OCH_2CH_2CH_2$—$OH$;
$CH_3$—$OCH_2CH_2CH_2$—$OCH_2CH_2CH_2$—$OH$;
$CH_3$—$OCH_2CH_2CH_2$—$OCH_2CH_2CH_2$—$OCH_2CH_2CH_2$—$OH$.

Further, one selected from the group consisting of ethyleneglycol monobutylether, diethyleneglycol monobutyl ether, triethyleneglycol monobutylether, ethyleneglycolmonomethylether, diethyleneglycolmonomethylether, triethyleneglycolmonoether, triethyleneglycolmonomethylether, ethyleneglycolmonoethylglycol, propyleneglycolmonomethylether, dipropyleneglycolmonomethylether and tripropyleneglycolmonomethylether may be used.

When the content of alkyleneglycolalkylether compound is less than 10 wt % in the composition according to the present invention, it is difficult to easily remove the color resist or organic insulating film. On the other hand, when the content of alkyleneglycolalkylether compound is more than 89 wt %, the activity of inorganic alkali metal ion is reduced, whereby it is difficult to improve the performance.

(C) Alkanolamine Compound

The alkanolamine compound used in the stripping composition according to the present invention improves the action of hydroxide compound and accelerates penetration into polymers of the color resist and swelling. An appropriate content of alkanolamine compound is in a range of approximately 5 to 45 wt %. When the content is less than 5 wt %, a stripping rate of the color resist or organic insulating film is delayed, which is not practical. Further, when the content is more than 45 wt %, swelling cannot be sufficiently prevented. The alkanolamine compound has at least one functional group represented by the following Formula (I) in its molecule.

(I)

(wherein $R^1$ and $R^2$ include a hydrogen atom, respectively, and are $C_1$-$C_8$ alkyl or $C_1$-$C_8$ alkenyl)

In one example, the functional group represented by Formula (I) may be as follows.

Examples of the alkanolamine compound are as follows.

The alkanolamine compound may be one selected from the group consisting of:

(1) stripping aliphatic alkanolamines such as N-hydroxymethylmethylamine, N-hydroxymethyldimethylamine, N,N-dihydroxymethylmethylamine, N-α-hydroxyethyl)methylamine, N-(α-hydroxyethyl)dimethylamine, N,N-(di-α-hydroxyethyl)methylamine, N-hydroxymethylethylamine, N-hydroxymethyldiethylamine, N,N-dihydroxymethylethylamine, N-(α-hydroxyethyl)ethylamine, N-α-hydroxyethyl)diethylamine, N,N-(di-α-hydroxyethyl)ethylamine, N-hydroxymethylpropylamine, N-hydroxymethyldipropylamine, N,N-dihydroxymethylpropylamine, N-(α-hydroxyethyl)propylamine, N-α-hydroxyethyl)dipropylamine, N,N-(di-α-hydroxyethyl)propylamine, N-hydroxymethylbutylamine, N-hydroxymethyldibutylamine, N,N-dihydroxymethylbutylamine, N-(α-hydroxyethyl)butylamine, N-α-hydroxyethyl)dibutylamine, N,N-(di-α-hydroxyethyl)butylamine, N-hydroxymethylpentylamine, N-hydroxymethyldipentylamine, N,N-dihydroxymethylpentylamine, N-(α-hydroxyethyl)pentylamine, N-hydroxymethylhexylamine, N-hydroxymethyldihexylamine, N,N-dihydroxymethylhexylamine, N-(α-hydroxyethyl)hexylamine, N-hydroxymethylheptylamine, N-hydroxymethyldiheptylamine, N,N-dihydroxymethylheptylamine, N-hydroxymethyloctylamine, N-hydroxymethyldioctylamine, N,N-dihydroxymethyloctylamine, N-α-hydroxyethyl)octylamine, N-hydroxymethylmethylethylamine, N-α-hydroxyethyl)methylethylamine, N-hydroxymethylmethylpropylamine, N-α-hydroxyethyl)methylpropylamine, N-hydroxymethylmethylbutylamine, N-α-hydroxyethyl)methylbutylamine, N-hydroxymethylethylpropylamine, N-α-hydroxyethyl)ethylpropylamine, N-hydroxymethylethylbutylamine, N-α-hydroxyethyl)ethylbutylamine, N-hydroxymethylethanolamine (CAS No. 65184-12-5), N-(α-hydroxyethyl)ethanolamine, N,N-dihydroxymethylethanolamine, N,N-(di-α-hydroxyethyl)ethanolamine, N-hydroxymethyldiethanolamine, N-α-hydroxyethyl)diethanolamine, N-hydroxymethyl-N-methylethanolamine, N-α-hydroxyethyl)-N-methylethanolamine, N-hydroxymethyl-N-propylethanolamine, N-α-hydroxyethyl)-N-propylethanolamine, N-hydroxymethyl-N-butylethanolamine, N-(α-hydroxyethyl)-N-butylethanolamine, N-hydroxymethylisopropanolamine (CAS No. 76733-35-2), N-(α-hydroxyethyl)isopropanolamine, N,N-dihydroxymethylisopropanolamine, N,N-(di-α-hydroxyethyl)isopropanolamine, N-hydroxymethyldiisopropanolamine, N-(α-hydroxyethyl)diisopropanolamine, N-hydroxymethyl-N-methylisopropanolamine, N-(α-hydroxyethyl)-N-methylisopropanol amine, N-hydroxymethyl-N-ethyl isopropanol amine, N-α-hydroxyethyl)-N-ethylisopropanolamine, N-hydroxymethyl-N-propylisopropanolamine, N-(α-hydroxyethyl)-N-propylisopropanolamine, N-hydroxymethyl-N-butylisopropanolamine, N-(α-hydroxyethyl)-N-butylisopropanolamine, N-hydroxymethylaminoethoxyethanol, N-(α-hydroxyethyl)aminoethoxyethanol, N,N-dihydroxymethylaminoethoxyethanol, N,N-(di-α-hydroxyethyl)aminoethoxyethanol, N-hydroxymethylamino-2-methylpropanol, N-(α-hydroxyethyl)amino-2-methylpropanol, N,N-dihydroxymethylamino-2-methylpropanol, and N,N-(di-α-hydroxyethyl)amino-2-methylpropanol;

(2) aliphatic alkanol polyamines such as N-hydroxymethylethylenediamine (CAS No. 41434-24-6), N-(α-hydroxyethyl)ethylenediamine, N,N-dihydroxymethylethylenediamine (CAS No. 70495-38-4), N-hydroxymethylbutylenediamine (CAS No. 66210-83-1), N-hydroxymethylpropylenediamine (CAS No. 66210-82-0), N,N'-dihydroxymethylbutylenediamine, N,N-dihydroxymethylbutylenediamine, N,N,N'-trihydroxymethylbutylenediamine, N,N,N'N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N,N-(di-α-hydroxyethyl)ethylenediamine, N,N,N'-trihydroxymethylethylenediamine, N,N,N'-(tri-α-hydroxyethyl)ethylenediamine, N,N,N'N'-tetrahydroxymethylethylenediamine, N,N,N'N'-(tetra-α-hydroxyethyl)ethylenediamine, N-hydroxymethyl-N-methylethylenediamine, N-(α-hydroxyethyl)-N-methylethylenediamine, N,N'-dihydroxymethyl-N-methylethylenediamine, N,N'-(di-α-hydroxyethyl)-N-methylethylenediamine, N,N',N'-(tri-α-hydroxyethyl)-N-methylethylenediamine, N,N',N'-trihydroxymethyl-N-methylethylenediamine, N-hydroxymethyl-N',N'-dimethylethylenediamine, N-(α-hydroxyethyl)-N',N'-dimethylethylenediamine, N,N-dihydroxymethyl-N',N'-dimethylethylenediamine, N,N-(di-α-hydroxyethyl)-N',N'-dimethylethylenediamine, N-hydroxymethyl-N,N',N'-trimethylethylenediamine, N-α-hydroxyethyl)-N,N',N'-trimethylethylenediamine, N-hydroxymethyl-N-ethylethylenediamine, N,N'-dihydroxymethyl-N-ethylethylenediamine, N,N',N'-trihydroxymethyl-N-methylethylenediamine, N-hydroxymethyl-N',N'-diethylethylenediamine, N,N-dihydroxymethyl-N',N'-diethylethylenediamine, N-hydroxymethyl-N,N'N'-triethylenediamine, N-hydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethylbutylenediamine, N,N-dihydroxymethylbutylenediamine, N,N,N'-trihydroxymethylbutylenediamine, N,N,N',N'-tetrahydroxymethylbutylenediamine, N-hydroxymethyldiethylenetriamine, N,N"-dihydroxymethyldiethylenetriamine and N-hydroxymethyltriethylenetetramine;

(3) aliphatic alkanol unsaturated amines such as N-hydroxymethylallylamine, N,N-dihydroxymethylallylamine, N-(α-hydroxyethyl)allylamine, N,N-(di-α-hydroxyethyl)allylamine, N-hydroxymethyldiallylamine, N-hydroxymethyl-N-methylallylamine and N-hydroxymethyl-N-ethylallylamine;

(4) cyclic alkanolamines such as N-hydroxymethylpyrrole, N-α-hydroxyethyl)pyrrole, N-hydroxymethyl-methylpyrrole, N-hydroxymethyl-dimethylpyrrole, N-hydroxymethyl-trimethylpyrrole, N-hydroxymethylpyrrolidine, N-α-hydroxyethyl)pyrrolidine, N-hydroxymethylmethylpyrrolidine, N-hydroxymethylpyrazole, N-hydroxymethylimidazole, N-hydroxymethyltriazole, N-hydroxymethyltetrazole, N-hydroxymethylpiperidine, N-(α-hydroxyethyl)piperidine, N-hydroxymethylpipecoline, N-hydroxymethyllupetidin, N-hydroxymethylpiperazine, N,N-dihydroxymethylpiperazine, N-(α-hydroxyethyl)piperazine, N-hydroxymethylmethylpiperazine, N-hydroxymethylmorpholine and N-α-hydroxyethyl)morpholine; and

(5) aliphatic alkanol etheramines such as N-hydroxymethylmethoxyethylamine, N-(α-hydroxyethyl)methoxyethylamine, N,N-dihydroxymethylmethoxyethylamine, N-hydroxymethylmethoxypropylamine, N,N-dihydroxymethylmethoxypropylamine, N-hydroxymethylethoxyethylamine, N-(α-hydroxyethyl)ethoxyethylamine, N,N-dihydroxymethylethoxyethylamine, N-hydroxymethylethoxypropylamine and N,N-dihydroxymethylethoxypropylamine.

Further, the alkanolamine compound may be a stripping compound, and may be represented as the following Formula (II):

wherein $R^1$ and $R^2$ are as defined above; $R^3$ is $C_1$-$C_{10}$ alkyl, $C_1$-$C_{10}$ alkenyl, amino, $C_1$-$C_{10}$ hydroxyalkyl, $C_1$-$C_{10}$ aminoalkyl, ($C_1$-$C_{10}$ alkyl)phenyl, phenyl($C_1$-$C_{10}$)alkyl, $C_1$-$C_{10}$ alkoxy, ($C_1$-$C_{10}$)alkoxy($C_1$-$C_{10}$)alkyl, hydroxy($C_1$-$C_{10}$)alkyloxy($C_1$-$C_{10}$)alkyl, $C_1$-$C_{10}$alkylamino, amino($C_1$-$C_{10}$)alkyloxy($C_1$-$C_{10}$)alkyl, hydroxy($C_1$-$C_{10}$)alkylamino($C_1$-$C_{10}$)alkyl; $R^4$ is hydrogen, $CH_2OH$, —$CH(OH)CH_3$, $C_1$-$C_{10}$ alkyl, $C_1$-$C_{10}$ alkenyl, amino, $C_1$-$C_{10}$ hydroxyalkyl, $C_1$-$C_{10}$ aminoalkyl, ($C_1$-$C_{10}$ alkyl)phenyl, phenyl($C_1$-$C_{10}$)alkyl, $C_1$-$C_{10}$ alkoxy, ($C_1$-$C_{10}$)alkoxy($C_1$-$C_{10}$)alkyl, hydroxy($C_1$-$C_{10}$)alkyloxy($C_1$-$C_{10}$)alkyl, $C_1$-$C_{10}$alkylamino, amino($C_1$-$C_{10}$)alkyloxy($C_1$-$C_{10}$)alkyl, or hydroxy($C_1$-$C_{10}$)alkylamino($C_1$-$C_{10}$)alkyl; and $R^3$ and $R^4$ may bind with nitrogen to form a cyclic amino group having 1 to 12 carbon atoms.

More preferred stripping alkanolamine may be represented by the following Formula (III):

wherein $R^3$ and $R^4$ are as defined above.

Examples of the preferred alkanolamine include N-hydroxymethylethanolamine, N-hydroxymethylisopropanolamine, N,N-dihydroxymethylethanolamine, N-hydroxymethyldiethanolamine, N-hydroxymethyl-N-methylethanolamine, N-hydroxymethyl-N-ethylethanolamine, N-hydroxymethylaminoethoxyethanol, N,N'-dihydroxymethylethylenediamine, N-hydroxymethylethylenediamine, N,N-dihydroxymethylethylenediamine, N,N,N'-trihydroxymethylethylenediamine, N,N,N',N'-tetrahydroxymethylethylenediamine, N-hydroxymethylbutylenediamine, N-hydroxymethylpropylenediamine, N,N'-dihydroxymethylbutylenediamine, N,N-dihydroxymethylbutylenediamine, N,N,N'-trihydroxymethylbutylenediamine, N,N,N',N'-tetrahydroxymethylbutylenediamine, N,N'-dihydroxymethylpropylenediamine, N,N-dihydroxymethylpropylenediamine, N,N,N'-trihydroxymethylpropylenediamine, N,N,N',N'-tetrahydroxymethylpropylenediamine, N-hydroxymethyldiethylenetriamine, N,N"-dihydroxymethyldiethylenetriamine, N-hydroxymethylmethylamine, N,N-dihydroxymethylmethylamine, N-hydroxymethyldimethylamine, N-hydroxymethylethylamine, N-hydroxymethyldiethylamine, N,N-dihydroxymethylethylamine, N-hydroxymethylpropylamine, N-hydroxymethylbutylamine, N-hydroxymethylpiperazine and N-hydroxymethylmorpholine. Depending on an application case, stripping alkanolamine represented by Formula (III), in which $R^4$ is hydrogen, may be satisfactory from the viewpoint of high stripping ability.

The above described alkanolamine compounds may be used alone or in combination with two or more other compounds. In a case where the alkanolamine compound is liquid, it may be directly contained in the stripping composition without dilution with any solvent. If necessary, the additive amine may be further added to the alkanolamine compound.

The useful additive amine of the present invention may include alkylamine, alkanolamine, polyamine, hydroxylamine, cyclic amine and combinations thereof.

Examples of alkylamine include aliphatic primary alkylamines such as methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine and octadecylamine; aliphatic secondary alkylamines such as dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine and propylisobutylamine; and aliphatic tertiary alkylamines such as trimethylamine, triethylamine, tripropylamine, tributylamine, tripentylamine, dimethylethylamine, dimethylpropylamine, methyldiethylamine and methyldipropylamine.

Examples of alkanolamine as the additive amine include aliphatic alkanolamines such as ethanolamine, N-methylethanolamine, N-ethylethanolamine, N-propylethanolamine, N-butylethanolamine, diethanolamine, triethanolamine, N-methyldiethanolamine, N-ethyldiethanolamine, isopropanolamine, diisopropanolamine, triisopropanolamine, N-methylisopropanolamine, N-ethylisopropanolamine, N-propylisopropanolamine, 2-aminopropan-1-ol, N-methyl-2-aminopropan-1-ol, N-ethyl-2-aminopropan-1-ol, 1-aminopropan-3-ol, N-methyl-1-aminopropan-3-ol, N-ethyl-1-aminopropan-3-ol, 1-aminobutan-2-ol, N-methyl-1-aminobutan-2-ol, N-ethyl-1-aminobutan-2-ol, 2-aminobutan-1-ol, N-methyl-2-aminobutan-1-ol, N-ethyl-2-aminobutan-1-ol, 3-aminobutan-1-ol, N-methyl-3-aminobutan-1-ol, N-ethyl-3-aminobutan-1-ol, 1-aminobutan-4-ol, N-methyl-1-aminobutan-4-ol, N-ethyl-1-aminobutan-4-ol, 1-amino-2-methylpropan-2-ol, 2-amino-2-methylpropan-1-ol, 1-aminopentan-4-ol, 2-amino-4-methylpentan-1-ol, 2-aminohexan-1-ol, 3-aminoheptan-4-ol, 1-aminooctan-2-ol, 5-aminooctan-4-ol, 1-aminopropan-2,3-diol, 2-aminopropan-1,3-diol, tris(oxymethyl)aminomethane, 1,2-diaminopropan-3-ol, 1,3-diaminopropan-2-ol and 2-(2-aminoethoxy)ethanol.

Examples of polyamine include ethylenediamine, propylenediamine, butylenediamine, trimethylenediamine, tetramethylenediamine, 1,3-diaminobutane, 2,3-diaminobutane, pentamethylenediamine, 2,4-diaminopentane, hexamethylenediamine, heptamethylenediamine, octamethylenediamine, nonamethylenediamine, N-methylethylenediamine, N,N-dimethylethylenediamine, trimethylethylenediamine, N-ethylethylenediamine, N,N-diethylethylenediamine, triethylethylenediamine, 1,2,3-triaminopropane, tris(2-aminoethyl)amine, tetra(aminomethyl)methane, diethylenetriamine, triethylenetetramine, tetraethylenepentamine, heptaethyleneoctamine and nonaethylenedecamine.

Examples of hydroxylamine include hydroxylamine, N-methylhydroxylamine, N-ethylhydroxylamine and N,N-diethylhydroxylamine.

Examples of cyclic amine include pyrrole, 2-methylpyrrole, 3-methylpyrrole, 2-ethylpyrrole, 3-ethylpyrrole, 2,3-dimethylpyrrole, 2,4-dimethylpyrrole, 3,4-dimethylpyrrole, 2,3,4-trimethylpyrrole, 2,3,5-trimethylpyrrole, 2-pyrroline, 3-pyrroline, pyrrolidine, 2-methylpyrrolidine, 3-methylpyrrolidine, pyrazole, imidazole, 1,2,3-trizaole, 1,2,3,4-tetrazole, piperidine, 2-pipecoline, 3-pipecoline, 4-pipecoline, 2,4-lupetidin, 2,6-lupetidin, 3,5-lupetidin, piperazine, 2-methylpiperazine, 2,5-dimethylpiperazine, 2,6-dimethylpiperazine and morpholine.

Among the above described additive amines, methylamine, ethylamine, propylamine, butylamine, ethanolamine, N-methylethanolamine, N-ethylethanolamine, diethanolamine, isopropanolamine, 2-(2-aminoethoxy)ethanol, ethylenediamine, propylenediamine, butylenediamine, diethylenetriamine, hydroxylamine, N,N-diethylhydroxylamine, piperazine and morpholine may be particularly preferable.

The molar ratio of additive amine and alkanolamine compound is not specifically limited, but may be in a range of about 0.01 to about 100, and more preferably about 0.1 to about 10.

(D) Inorganic Salt Compound

The inorganic salt compound used in the present invention improves the effect of the hydroxide compound and accelerates binding with polymer segments of the color resist. The inorganic salt compound may be used in a range of 0.01 to 5 wt % with respect to a total weight of the composition. When the content of the inorganic salt compound is too high, the moisture or organic solvent is evaporated during stripping, so that the salt is precipitated in a solid form. Thus, the thin film transistor of the substrate, in particular the bottom substrate, may be damaged. Meanwhile, when the content of the inorganic salt compound is too low, the stripping performance is reduced. Accordingly, the content may be controlled in the above range. The inorganic salt compound may include one selected from the group consisting of potassium hydroxide, potassiumacetate, potassiumbenzoate, potassiumnitrate, potassiumcarbonate, potassiumpyrophsophate and combinations thereof.

The potassium hydroxide (KOH) as an example of the inorganic salt compound is a strong alkaline material suitable for maintaining an alkaline concentration. The color resist or organic insulating film is dissolved by a KOH stripping solution in the swollen gel region penetrated by the KOH solution. When KOH is dissolved in water, it is dissociated into $K^+$ ion and $OH^-$ ion. The $OH^-$ ion deprotonates H of the $^-OH$ functional group of the color resist. Therefore, the $OH^-$ ion becomes $H_2O$, and the color resist becomes $O^-$ ion (phenolate). Generation of the phenolate significantly weakens the interaction between molecules of the color resist to increase water solubility. Further, the $K^+$ ion easily penetrates into the swollen gel region to be a salt, thereby enhancing water solubility of the color resist and stripping the color resist on the substrate. The color resist may be a color resist formed on the top substrate or bottom substrate. Further, the negative type and positive type organic insulating films are stripped through the same stripping mechanism.

A method for preparing the stripping composition according to the present invention is not specifically limited. For example, the stripping composition may be prepared by the known method, in which the materials of (A) to (D) are supplied in a mixer equipped with a simple stirrer, stirred at room temperature to obtain a homogenous solution, and if necessary followed by filtering with a membrane filter having a predetermined pore diameter.

Further, the stripping composition according to the present invention may further include at least one material of the following (E) to (H).

(E) Hydroxyl Amine Compound

The hydroxyl amine compound contained in the stripping composition according to the present invention improves the effect of the hydroxide compound and promotes the dissolution of the color resist by radical reaction. The content of the hydroxyl amine compound may be in a range of 0.5 to 10 wt %. When the content of the hydroxyl amine compound is less than 0.5 wt %, the defective color resist can hardly be removed. When the content of the hydroxyl amine compound is more than 10 wt %, the bottom metal layers such as aluminum and aluminum alloy may be excessively corroded.

The hydroxyl amine compound may be soluble in water, and may include one selected from the group consisting of ethanolamines, methanolamines, diethanolamines, triethanolamines and combinations thereof. Preferably, the hydroxyl amine compound may include one selected from the group consisting of monoethanolamine, monomethanolamine, isopropanolamine, dimethanolamine, diethanolamine, dipropanolamine, trimethanolamine, triethanolamine, tetraethanolamine and combinations thereof.

(F) Corrosion-Resistant Agent

The corrosion-resistant agent contained in the stripping composition according to the present invention prevents damage of the bottom layer and contact of the metal materials with the stripping composition from corrosion. The corrosion-resistant agent may be in a range of 0.01 to 5 wt % with respect to the stripping composition. The corrosion-resistant agent may be one selected from the group consisting of sugars, sugar alcohol, an aromatic hydroxy compound, acetylene alcohol, a carboxylic acid compound and an anhydride thereof, a triazole compound and combinations thereof.

Examples of sugars include monosaccharides having 3 to 6 carbon atoms such as glycerine aldehyde, threose, ascorbic acid, isoascorbic acid, arabinose, xylose, ribose, ribulose, xylulose, glucose, mannose, galactose, tagatose, allose, altrose, gulose, idose, talose, sorbose, psicose and fructose, and disaccharides such as trihalose.

Examples of sugar alcohol include threitol, erythritol, adonitol, arabitol, xylitol, talitol, sorbitol, mannitol, iditol, dulcitol and inositol.

Examples of the aromatic hydroxy compound include phenol, cresol, xylenol, pyrocatechol, resorcinol, hydroquinone, pyrogallol, 1,2,4-benzenetriol, salicylic alcohol, p-hydroxybenzyl alcohol, p-hydroxyphenethyl alcohol, p-aminophenol, m-aminophenol, diaminophenol, aminoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid and gallic acid.

Examples of acetylene alcohol include 2-butyene-1,4-diol, 3,5-dimethyl-1-hexyen-3-ol, 2-methyl-3-butyen-2-ol, 3-methyl-1-pentien-3-ol, 3,6-dimethyl-4-octyene-3,6-diol, 2,4,7,9-tetramethyl-5-decyene-4,7-diol and 2,5-dimethyl-3-hexyene-2,5-diol.

Examples of the carboxylic acid compound and anhydride thereof include formic acid, acetic acid, propionic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, diglycolic acid, lactic acid, malic acid, citric acid, acetic anhydride, phthalic anhydride, maleic anhydride, succinic anhydride and salicylic acid.

Examples of the triazole compound include tolytriazole, benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

Among them, the preferred corrosion-resistant agent may be catechols such as pyrocatechol, sorbitol, xylitol, gallic acid, 2-butyene-1,4-diol, phthalic acid, phthalic anhydride, salicylic acid, ascorbic acid, tolytriazole and benzotriazole. The corrosion-resistant agent may be used alone or in combination with two or more other agents.

(G) Polar Solvent

As the polar solvent used in the present invention, sulfur compounds such as dimethylsulfoxide or alkyl pyrrolidones such as n-methylpyrrolidone may be used.

The sulfur compound is well penetrated and highly soluble into the color resist or organic insulating film. The sulfur compound penetrates into the polymers of the color resist or organic insulating film to enhance swelling. The polar sulfur compound is preferably used in a range of 1 to 50 wt % with respect to the stripping composition. When the content is less than 1 wt %, the color resist or organic insulating film can hardly be removed. When the content is more than 50 wt %, the miscibility with the hydroxide compound is reduced, so that performance improvement can't be expected. The polar sulfur compound used in the present invention may be one selected from the group consisting of dimethylsulfoxide, diethylsulfoxide, dipropylsulfoxide, sulforan and mixtures thereof.

Alkyl pyrrolidone functions as a solvent dissolving the color resist or organic insulating film, and reduces the surface tension of the stripping composition to improve the wettability to the color resist or organic insulating film. The content of alkyl pyrrolidone may be 1 wt % or more in order to sufficiently perform the function, and the content may be 50 wt % or less from the viewpoint of cost effectiveness and to prevent dilution of other components. Examples of alkyl pyrrolidone include pyrrolidone, n-methylpyrrolidone, n-ethyl pyrrolidone, n-propyl pyrrolidone, n-octyl pyrrolidone, n-cyclohexyl pyrrolidone, n-dodecyl pyrrolidone, 2-pyrrolidone, 1-hydroxyethyl-2-pyrrolidone, 1-hydropropyl-2-pyrrolidone and the like. Preferably n-methylpyrrolidone may be used, but the present invention is not limited thereto.

(H) Water

In the stripping composition according to the present invention, water may be pure water filtered through an ion exchange resin, and more preferably ultra pure water having a specific resistance of 18 MΩ or more. Water may be used in a residual amount of the stripping composition capable of containing any one or more of (E) to (G) in the composition of (A) to (D). When the content is low, the viscosity of the stripping composition increases to reduce the penetration ability of the stripping solution and the discharge ability of the stripping composition. When the content is high, the stripping composition is excessively diluted to reduce the stripping ability.

Hereinafter, the stripping method according to the present invention will be described.

Figure 1:
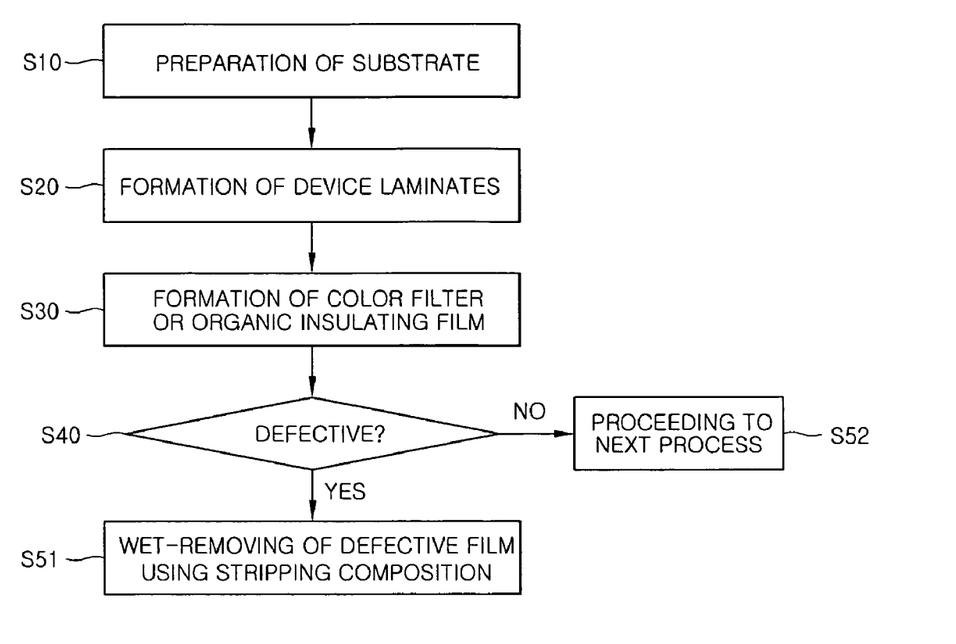
FIG. 1 is a flow chart showing a stripping process of a color filter or organic insulating film formed on a substrate after defect inspection to reuse the substrate.

FIG. 1 is a flow chart showing a stripping process of a color filter or organic insulating film formed on a substrate after defect inspection to reuse a substrate.

The stripping method according to the present invention includes: forming a film containing organic materials on a substrate; and stripping the film on the substrate using a stripping composition containing (A) about 0.5 to about 45 wt % of hydroxide compound, (B) about 10 to about 89 wt % of alkyleneglycolalkylether compound, (C) about 5 to about 45 wt % of alkanolamine compound and (D) about 0.01 to about 5 wt % of inorganic salt compound.

First, the substrate is prepared (S10), and device laminates are formed on the substrate (S20). The substrate may be a top or bottom substrate of a liquid crystal display. When the substrate is the bottom substrate, the device laminates may be a thin film transistor including an electrode formed of a metal including Al. Further, when the substrate is the top substrate, forming the device laminates (S20) may be omitted. Then, the color filter or organic insulating film is formed on the device laminates of the substrate (S30). Any one of positive and negative type organic insulating films can be used. The substrate, on which the color filter or organic insulating film is formed, goes through an inspection process for determining if it is defective (S40). The substrate goes through a next process if it is not defective (S52). On the other hand, a defective substrate goes through the stripping process using the stripping composition containing (A) 0.5 to 45 wt % of hydroxide compound; (B) 10 to 89 wt % of alkyleneglycolalkylether compound; (C) 5 to 45 wt % of alkanolamine compound; and (D) 0.01 to 5 wt % of inorganic salt compound (S51). By the stripping process (S51), the color filter or organic insulating film on the substrate can be removed easily without damaging the device laminates formed on the bottom substrate. The substrate, on which the color filter or organic insulating film is removed, goes back to the step of forming the color filter or organic insulating film (S30).

Example

Hereinafter, Examples of the present invention will be described. In the following Examples, the percentage and mixing ratio are based on weight, unless otherwise mentioned.

Each component is mixed in a ratio shown in the following Table 1 to prepare each stripping composition of Examples and Comparative Examples.

TABLE 1

|  |  | Hydroxide compound | | Alkyleneglycol alkylether compound | | Alkanolamine compound | | Hydroxyl amine compound | Polar solvent | Inorganic salt compound | | Corrosion-resistant agent | | Water |
|---|---|---|---|---|---|---|---|---|---|---|---|---|---|---|
| Example | 1 | TMAH | 6.25 | MDG | 43 | MEA | 30 | 2 | — | — PA | 0.05 | BT | 1 | 17.7 |
|  | 2 | TMAH | 6.25 | MDG | 53 | DEA | 20 | 2 | — | — PA | 0.05 | BT | 1 | 17.7 |
|  | 3 | TMAH | 6.25 | MDG | 63 | TEA | 10 | 2 | — | — PA | 0.05 | BT | 1 | 17.7 |

TABLE 1-continued

| | | Hydroxide compound | | Alkyleneglycol alkylether compound | | Alkanolamine compound | | Hydroxyl amine compound | Polar solvent | | Inorganic salt compound | | Corrosion-resistant agent | | Water |
|---|---|---|---|---|---|---|---|---|---|---|---|---|---|---|---|
| | 4 | TMAH | 6.25 | MG | 43 | MEA | 30 | 2 | — | — | PA | 0.05 | BT | 1 | 17.7 |
| | 5 | TMAH | 6.25 | MG | 53 | DEA | 20 | 2 | — | — | PA | 0.05 | BT | 1 | 17.7 |
| | 6 | TMAH | 6.25 | MG | 63 | TEA | 10 | 2 | — | — | PA | 0.05 | BT | 1 | 17.7 |
| | 7 | TMAH | 6.25 | MDG | 30 | MEA | 30 | 2 | NMP | 10 | PA | 0.05 | BT | 1 | 20.7 |
| | 8 | TMAH | 6.25 | MDG | 10 | MEA | 40 | 2 | DMSO | 40 | PA | 0.05 | BT | 1 | 10.7 |
| | 9 | TMAH | 6.25 | MDG | 30 | MEA | 30 | 2 | Sulfolane | 10 | PA | 0.05 | BT | 1 | 20.7 |
| | 10 | TMAH | 6.25 | MDG | 30 | TEA | 10 | 2 | NMP | 10 | PA | 0.05 | BT | 1 | 20.7 |
| | 11 | TMAH | 6.25 | MDG | 10 | TEA | 10 | 2 | DMSO | 40 | PA | 0.05 | BT | 1 | 10.7 |
| | 12 | TMAH | 6.25 | MDG | 30 | TEA | 10 | 2 | Sulfolane | 10 | PA | 0.05 | BT | 1 | 20.7 |
| | 13 | TMAH | 6.25 | MDG | 43 | MEA | 30 | 2 | — | — | PB | 0.05 | BT | 1 | 17.7 |
| | 14 | TMAH | 6.25 | MDG | 43 | MEA | 30 | 2 | — | — | PN | 0.05 | BT | 1 | 17.7 |
| | 15 | TMAH | 6.25 | MDG | 43 | MEA | 30 | 2 | — | — | KOH | 0.05 | BT | 1 | 17.7 |
| | 16 | TMAH | 6.25 | MDG | 43 | MEA | 30 | 2 | — | — | PA | 0.05 | BT | 1 | 17.7 |
| | 17 | TMAH | 6.25 | MDG | 43 | MEA | 30 | 2 | — | — | PA | 0.05 | Catechol | 1 | 17.7 |
| | 18 | TMAH | 6.25 | MDG | 43 | MEA | 30 | 2 | — | — | PA | 0.05 | AA | 1 | 17.7 |
| | 19 | TMAH | 6.25 | MDG | 43 | MEA | 30 | 2 | — | — | PA | 0.05 | TT | 1 | 17.7 |
| | 20 | TMAH | 5 | MDG | 67 | MEA | 10 | 2 | DMSO | 10 | PA | 0.2 | BT | 0.5 | 5.3 |
| Comparative | 1 | TMAH | 12.5 | MDG | 50 | MEA | 10 | — | — | — | — | — | — | — | 27.5 |
| Example | 2 | TMAH | 6 | — | — | MEA | 10 | — | DMSO | 60 | — | — | — | — | 24 |
| | 3 | — | — | MDG | 50 | MEA | 10 | — | DMSO | 39 | — | — | BT | 1 | — |

(TMAH: tetramethylammoniumhydroxide, MDG: diethyleneglycolmethylether, MG: ethyleneglycolmethylether, MEA: monoethanolamine, DEA: diethanolamine, TEA: triethanolamine, NMP: n-methylpyrrolidone, DMSO: dimethylsulfoxide, Sulfolane, PA: potassiumacetate, PB: potassiumbenzoate, PN: potassiumnitrate, KOH: potassium hydroxide, AA: acetylene alcohol, BT: benzotriazole, TT: tolytriazole)

In order to test performance of the stripping compositions prepared in Examples 1 to 20 and Comparative Examples 1 to 3, a color resist stripping test was carried out using a color filter as follows.

Sample Preparation

Color filter patterns were formed on a glass substrate on the bottom of which a Mo/Al/Mo multilayer was deposited and patterns were formed. The color resist was coated in the order of red, green, and blue using the following photolithography process. A color resist composition conventionally used (Dongjin Semichem Co., Ltd. product name: DCR-7255) was spin-coated to have a final film thickness of 1.7 μm. Subsequently, the resist film was pre-baked on a hot plate at 90° C. for 120 seconds, exposed to light, and developed with 1% KOH developer at room temperature for 60 seconds. Then, the sample, on which patterns were formed, was hard-baked in an oven at 220° C. for 20 seconds.

Further, in order to prepare a sample on which an organic insulating film is coated, a glass substrate, on the bottom of which a Mo/Al/Mo multilayer was deposited and patterns were formed, was spin-coated with an organic insulating film composition (Dongjin Semichem Co., Ltd. product name: SOJN-091) that had been developed, so that its final thickness became 4.0 μm. Subsequently, the organic insulating film was soft-baked on a hot plate at 90° C. for 120 seconds, exposed to light, and then developed with 2.38% TMAH developer at room temperature for 70 seconds. The film was entirely exposed to light and hard-baked at 130° C. for 3 minutes.

Stripping Test

The prepared samples were immersed in the stripping composition for removing a color resist and organic insulating film materials at 70° C., and the time taken to completely strip the color resist or organic insulating film on the substrate was measured. Subsequently, the samples was taken out of the stripping composition, washed with ultra pure water, and dried with nitrogen gas. Then, the sample was observed with a microscope by magnifying 100 times, to check if residual color resist remains in the patterns. Further, in order to observe if the bottom substrate was damaged, the samples applied with the color resist were immersed in each stripping composition for 30 minutes, and then the samples were observed with a scanning electron microscope (SEM). The time taken to completely strip the organic insulating film material and color resist so that no residual can be observed is shown in the following Table 2.

TABLE 2

| | | Degree of damage in Al film | Removal time (Organic insulating film) | Removal time (Color resist) |
|---|---|---|---|---|
| Example | 1 | ◉ | 1 minute | 10 minutes |
| | 2 | ◉ | 1 minute | 10 minutes |
| | 3 | ◉ | 1 minute | 10 minutes |
| | 4 | ◉ | 1 minute | 10 minutes |
| | 5 | ◉ | 1 minute | 10 minutes |
| | 6 | ◉ | 1 minute | 10 minutes |
| | 7 | ◉ | 1 minute | 10 minutes |
| | 8 | ◉ | 1 minute | 10 minutes |
| | 9 | ◉ | 1 minute | 10 minutes |
| | 10 | ◉ | 1 minute | 10 minutes |
| | 11 | ◉ | 1 minute | 10 minutes |
| | 12 | ◉ | 1 minute | 10 minutes |
| | 13 | ◉ | 1 minute | 10 minutes |
| | 14 | ◉ | 1 minute | 10 minutes |
| | 15 | ◉ | 1 minute | 10 minutes |
| | 16 | ◉ | 1 minute | 10 minutes |
| | 17 | ◉ | 1 minute | 10 minutes |
| | 18 | ◉ | 1 minute | 10 minutes |
| | 19 | ◉ | 1 minute | 10 minutes |
| | 20 | ◉ | 1 minute | 10 minutes |
| Comparative | 1 | X | 1 minute | 15 minutes |
| Example | 2 | X | 1 minute | 15 minutes |
| | 3 | Δ | 20 minutes or more | 30 minutes or more |

(X: lines are completely removed, Δ: Al is seriously damaged, ○: surface pitting occurs, ◉: no damage is observed)

As shown in Table 2, Examples of the present invention were found to have the excellent performance of removing the color resist or organic insulating film, as well as not damaging the bottom substrate. Further, they have the excellent performance of removing the color resist and preventing corrosion, as compared to Comparative Examples.

Advantageously, a color resist or organic insulating film can be easily removed by the stripping composition according to the present invention. In particular, the color resist or negative type organic insulating film formed on a thin film transistor can be removed. Further, the stripping process can be performed without giving any damage to the thin film transistor of a bottom substrate by the stripping composition and stripping method according to the present invention, upon removing the color resist or organic insulating film.

Although the present invention has been described with reference to the preferred embodiments, it should be noted that various changes and modifications can be made by those skilled in the art without departing from the technical spirit of the appended claims.

What is claimed is:

1. A stripping method, the method comprising:
    forming a film containing organic materials on a substrate; and
    stripping the film on the substrate using a stripping composition including about 0.5 to about 45 wt % of a hydroxide compound, about 10 to about 89 wt % of an alkyleneglycolalkylether compound, about 5 to about 45 wt % of an alkanolamine compound, and about 0.01 to about 5 wt % of an inorganic salt compound.

2. The stripping method of claim 1, further comprising: inspecting the film for defects; and determining the film to be defective when a defect is detected, before stripping the film.

3. The stripping method of claim 1, wherein the film is a color filter.

4. The stripping method of claim 1, wherein the film is an organic insulating film.

5. The stripping method of claim 4, wherein the organic insulating film is a negative type.

6. The stripping method of claim 1, wherein the substrate comprises device laminates and the film is formed on the device laminates.

7. The stripping method of claim 6, wherein the device laminates comprise a thin film transistor.

8. The stripping method of claim 7, wherein the thin film transistor comprises an electrode formed of a metal including Al.

* * * * *